United States Patent
Iwamoto

[19]

[11] Patent Number: 6,037,026
[45] Date of Patent: Mar. 14, 2000

[54] SUBSTRATE CARRIER JIG AND METHOD OF PRODUCING LIQUID CRYSTAL DISPLAY ELEMENT BY USING THE SUBSTRATE CARRIER JIG

[75] Inventor: Makoto Iwamoto, Yamatokoriyama, Japan

[73] Assignee: Sharp Kabushiki Kaisha, Osaka, Japan

[21] Appl. No.: 09/047,415

[22] Filed: Mar. 25, 1998

Related U.S. Application Data

[62] Division of application No. 08/763,100, Dec. 10, 1996, Pat. No. 5,869,150, which is a continuation of application No. 08/397,374, Mar. 2, 1995, abandoned.

[30] Foreign Application Priority Data

Jul. 18, 1994 [JP] Japan ................................. 6-165332
Dec. 6, 1994 [JP] Japan ................................. 6-302493

[51] Int. Cl.$^7$ .................................................. C09K 19/00
[52] U.S. Cl. .......................... 428/40; 428/343; 428/355; 428/447; 428/450; 428/458; 428/688
[58] Field of Search .............................. 428/40, 343, 354, 428/355, 422, 429, 432, 447, 450, 458, 688; 427/510; 430/287.1; 257/680, 659; 525/193

[56] References Cited

U.S. PATENT DOCUMENTS

| | | |
|---|---|---|
| 2,889,038 | 6/1959 | Kalleberg . |
| 3,762,946 | 10/1973 | Stow et al. . |
| 3,839,075 | 10/1974 | Moriyama et al. . |
| 4,503,705 | 3/1985 | Polchaninoff . |
| 4,688,053 | 8/1987 | Noguchi et al. . |
| 4,737,387 | 4/1988 | Yen . |
| 4,822,655 | 4/1989 | Foster . |
| 4,839,206 | 6/1989 | Waldenberger . |
| 5,061,559 | 10/1991 | Ogusi et al. . |
| 5,068,713 | 11/1991 | Toda . |
| 5,355,016 | 10/1994 | Swirbel et al. . |
| 5,360,873 | 11/1994 | Ohkawa et al. . |
| 5,372,865 | 12/1994 | Arakawa et al. . |
| 5,476,690 | 12/1995 | Ohta et al. . |

FOREIGN PATENT DOCUMENTS

| | | |
|---|---|---|
| 2 049 296 | 5/1971 | Germany . |
| 88 05 840 | 8/1988 | Germany . |
| 3844261 A1 | 7/1990 | Germany . |
| 58-54316 | 3/1983 | Japan . |
| 58-147713 | 9/1983 | Japan . |
| 60-41018 | 3/1985 | Japan . |
| 60-87313 | 5/1985 | Japan . |
| 61-116327 | 6/1986 | Japan . |
| 61-116328 | 6/1986 | Japan . |
| 3-5718 | 1/1991 | Japan . |
| 3-192321 | 8/1991 | Japan . |

*Primary Examiner*—Elizabeth Evans

[57] ABSTRACT

A substrate carrier jig is a jig which supports a substrate of a liquid crystal display element on its surface and carries the substrate with the jig to a process. A sticky layer whose adhesion for holding the substrate to be stuck to the surface of the jig is maintained constant even after repeated use. The substrate composed of a thin sheet glass, plastic, etc. is stuck to the jig, and the substrate when the jig is carried to a process for producing a liquid crystal display element. As a result, it is possible to produce a liquid crystal display element by commonly using a producing line for a conventional liquid crystal display element for glass even if substrate materials such as thin sheet glass, plastic, etc. which independently have no strength and stiffness are used. Furthermore, since the jig can be repeatedly used, the cost of producing a liquid crystal display element can be greatly reduced as compared to a disposable jig. Also a method of producing the carrier jig is provided.

27 Claims, 5 Drawing Sheets

SUBSTRATE CARRIER JIG AND METHOD OF PRODUCING LIQUID CRYSTAL DISPLAY ELEMENT BY USING THE SUBSTRATE CARRIER JIG

This application is a divisional of copending Application Ser. No. 08/763,100, filed on Dec. 10, 1996, now U.S. Pat. No. 5,869,150 issued Feb. 9, 1999, which is a continuation of application Ser. No. 08/397,374 filed on Mar. 2, 1995, now abandoned, the entire contents of which are hereby incorporated by reference.

FIELD OF THE INVENTION

The present invention relates to a substrate carrier jig and a method for making the substrate carrier, which is used for producing a liquid crystal display element in which a thin sheet glass substrate, a plastic substrate, etc. are used, and to a process for producing the liquid crystal display element by using the jig.

BACKGROUND OF THE INVENTION

A glass substrate for a liquid crystal display element has been considered for making the substrate thin in order to eliminate double image of display and to accomplish a light weight device. However, in the case where a glass substrate is individually carried to a producing process, thinning of the substrate is limited to 0.7 mm in a mass production level because of problems, such as fragility, liability to breakage. For these reasons it is difficult produce liquid crystal display elements in which large glass (300 mm×300 mm and above) whose thickness is 0.5 mm or 0.3 mm.

Meanwhile, a liquid crystal display element in which a plastic substrate is used has been developed instead of a glass substrate. As to a producing method for the plastic substrate, for example, Japanese Unexamined Patent Publication No. 3-5718/1991 (Tokukaihei 3-5718) discloses a method of independently carrying a sheet-like plastic substrate or a method of successively carrying a roll-like plastic substrate.

However, in both cases where the substrate is individually carried and the roll-like substrate is successively carried, it is more difficult to produce a liquid crystal display element in which a plastic substrate is used compared to a liquid crystal display element in which a glass substrate is used because of small stiffness, namely, no body, a low heat deformation temperature, liability to damage due to low surface hardness, liability to occurrence of deformation such as warpage, expansion and shrinkage during heat treatment.

Therefore, for example, Japanese Unexamined Patent Publication No. 60-41018/1985 (Tokukaisho 60-41018) discloses a method of producing a liquid crystal display element by carrying a plastic substrate to processes with it fixed to a frame, and Japanese Unexamined Patent Publication No. 58-147713/1983 (Tokukaisho 58-147713) discloses a method of producing a liquid crystal display element by contact-bonding a circumferential edge section of a plastic substrate to a carrier so as to cut the contact-bonded section.

In addition, the above-mentioned Japanese Unexamined Publication No. 3-5718/1991 (Tokukaihei 3-5718) also discloses a method of producing a liquid crystal display element by laminating polymeric resin which becomes a plastic substrate on a mold-releasing film.

The mold-releasing film is formed by applying a silicone-type resin as a mold-releasing agent to a film which is a carrier.

Here, the silicone-type resin, for example, silicone is used for various applications as a general mold-releasing agent, and it is sorted into oil-type, paste-type, solution-type, baking-type, emulsion-type, water-soluble-type, spray-type, etc. For example, in order to improve releasability from a sealing sticky surface, the silicone as a mold-releasing layer is used for a surface of sealing release paper, and is used as a mold-releasing agent for easily releasing moldings from a metal mold at the time of forming resin, for example. Silicone which is used as a mold-releasing agent has no adhesion properties itself, or if the silicone has adhesion properties, it is used after its adhesion is reduced.

However, in the producing method with the plastic substrate fixed to the frame, the plastic substrate is deformed in the frame, so it is difficult to maintain evenness of the surface. In this case, various printing equipments, light exposure equipments, etc. during a process for producing a liquid crystal display element require, a special stage-type design, for example, so as to support evenness in the frame. This increases cost of the equipments and this has problems, such as incompatibility with a glass substrate.

On the contrary, in the method of producing a liquid crystal display element by laminating polymeric resin which becomes a plastic substrate on a mold-releasing film, there exist the following problems.

(1) Cost is high because a carrier such as a mold-releasing film is used only once.

(2) Stiffness of a carrier such as a mold-releasing film is low and carrying to processes is not smoothly carried out.

(3) Producing processes, equipments and conditions which can be used are greatly limited.

Particularly in a plastic substrate with flexibility, deformation is liable to occur along a hole and a channel of an absorption stage depending upon its material and thickness. For this reason, failure of printing and failure of an orientation process as well as catching by a print of an offset printer occur, and besides, at the time of temporary drying immediately after printing, a substrate is bent by heat on a hot plate, for example, namely, the substrate shows dance-like movement, so stable drying cannot be carried out.

(4) Stable carrying cannot be performed from a point of adhesion because of low adhesion of a mold-releasing film to polymeric resin, and especially, in the case of heating treatment, (a) bubbles on the interface between the mold-releasing film and the polymeric resin, or (2) partial peeling occurs, so the subsequent processes cannot be carried out.

SUMMARY OF THE INVENTION

The present invention has been accomplished in view of the above-mentioned conventional problems and it is an object of the present invention to provide a substrate carrier jig and a process for producing a liquid crystal display element by using the jig, which can ensure reduction in cost of producing the liquid crystal display element, smooth process-carrying and stable production, and improvement in performance of the liquid crystal display element.

In order to accomplish the above problems, the substrate carrier jig of the present invention (hereinafter, referred to as the jig) is a jig which is carried to processes with a substrate of the liquid crystal display element supported on the surface of the jig, and a sticky layer whose adhesion for holding the substrate to be stuck to the surface is maintained substantially constant even after repeated use.

The jig is provided with a sticky layer on a carrier. Adhesion of the sticky layer is maintained substantially constant even after repeated use. The carrier is composed of a material with stiffness which is required for handling at the time of carrying out a process for producing a liquid crystal display element, such as a glass plate, a plastic plate, with a prescribed thickness.

For this reason, even if a substrate material which independently has no strength and no stiffness is used, it is possible to produce a liquid crystal display element commonly using a conventional production line of liquid crystal display elements for glass by proceeding the process for producing the liquid crystal display element with a thin sheet-like glass substrate, a plastic substrate, etc. stuck to the jig. Furthermore, since the jig can be repeatedly used, it is possible to greatly reduce cost of producing a liquid crystal display element compared to a disposable jig.

As to the sticky layer, it is necessary that when the sticky layer stuck to a substrate is carried to processes, sufficient adhesion to the substrate is retained and also the substrate can be peeled immediately after completion of the processes. Examples of materials composing such a sticky layer which is capable of temporary adhesion and later of peeling are silicone gel, silicone rubber, phloro-silicone rubber, butyl rubber, urethane rubber, natural rubber, butadiene rubber, ethylene propylene rubber, chloroprene rubber, nitrile rubber, nitrile isoprene rubber, acrylic rubber, fluororubber, chlorosulfonated polyethylene, chlorinated polyethylene, epichlorohydrine rubber, etc. Among these materials, the butyl rubber, the silicone rubber are suitable from a standpoint of adhesion, heat resistance, oil and chemical resistance, surface evenness, light-resistance, ozone resistance, etc.

The adhesion is determined comprehensively by an empirical method based upon a material, thickness and surface configuration of a thin sheet glass substrate and a plastic substrate, carrying process conditions, jig peeling workability and other factors. The adhesion can be adjusted (increased or decreased) (1) by increasing or decreasing an adhesion area with the substrate (whole area adhesion to partial area adhesion), (2) by changing hardness of adhesive mass (soft to hard), etc. The adhesion area with the substrate can be increased or decreased by changing a surface configuration of a sticky layer (plain to uneven) and by changing a forming area of the sticky layer, and the hardness of the adhesive mass can be changed by adjusting a polymerization degree, a crosslinking degree, a mixing ratio, an additive, a cure agent, etc. of the sticky layer.

In the case where a setting range of the adhesion is represented by peeling adhesion per width of 20 mm, it is suitable that the setting range is from 50 g to 800 g. In the case where the peeling adhesion is less than 30 g, workability at the time of peeling a thin sheet glass substrate and a plastic substrate from a sticky layer of a jig becomes excellent. But since bubbles or cleaning fluid enter an adhesive surface, or peeling of the substrate from the jig occurs in some process conditions at the time of carrying the jig to which the thin sheet glass substrate and the plastic substrate are adhered (heating temperature and cleaning condition), stable process carrying cannot be performed. On the contrary, when the peeling adhesion is too great, stable carrying in a condition that the substrate is stuck to the jig can be obtained. But workability of the jig peeling after the completion of the process is bad, so defects such as a crack, a deformation occur on the thin sheet glass substrate or the plastic substrate due to stress at the time of peeling in some cases. Therefore, it is desirable that the peeling adhesion is not more than 800 g.

In the above arrangement, it is preferable that an intermediate layer is provided between the carrier and the sticky layer. In this case, even if a material in which a great difference in heat expansion coefficients between the carrier and the sticky layer exists is selected, stress and distortion due to a difference in heat expansion coefficient caused by a change in temperature are relaxed by setting the heat expansion coefficient of the intermediate layer between the heat expansion coefficients of the sticky layer and the carrier. Furthermore, the sticky layer can be formed thinner by producing the jig in the manner that the sticky layer is preliminarily formed on the intermediate layer, and the intermediate layer with the sticky layer is adhered to the carrier. In addition, workability at the time of forming the thin sticky layer on the carrier is improved by uniting the intermediate layer and the sticky layer. This can reduce cost of producing a liquid crystal display element.

Moreover, as to the jig, it is preferable that a light transmitting section for improving transmittance of a visible light is provided in a place corresponding to an alignment mark of an electrode pattern formed on the substrate. In this case, positioning can be made using the alignment mark of each process for producing a liquid crystal display element with the substrate stuck to the jig. As a result, high accurate positioning can be made using a method for automatic image recognition, so a liquid crystal display element whose display quality is excellent can be produced.

In the method of producing a liquid crystal display element according to the present invention, the substrate is stuck to the jig with the above arrangement. The substrate stuck to the jig successively undergoes processes for forming a liquid crystal display element while the jig is being carried out through the processes for producing the a liquid crystal display element. After completion of the prescribed processes, the substrate is peeled from the substrate carrier jig, and the substrate carrier jig is reused for sticking a new substrate so that a liquid crystal display element is produced.

In the above producing method, it is preferable that printing processes of an insulating film and an alignment film, etc. are carried out with the substrate stuck to the jig. In these printing processes, more uniform printing is required. Therefore, a substrate is stuck to a jig having stiffness of a certain degree, thereby controlling deformation along an absorption hole and a groove of a printing stage which is liable to occur particularly in the case of a plastic substrate. As a result, excellent printing is secured. Moreover, during printing, a plastic substrate is prevented from being caught by a print roller by setting adhesion of a sticky layer on a jig to not less than a certain degree.

In the above producing method, it is more preferable that a calcination process at the time of forming an insulating film and an alignment film is carried out with a substrate stuck to the jig. In a process for forming an insulating film and an alignment film, temporary drying is carried out immediately after the printing, and then main calcination is carried out. Here, since the substrate is stuck to the jig having a stiffness of a certain degree, dance-like movement of the plastic substrates due to heat on a hot plate is prevented. Also in the case where main calcination is carried out at a temperature of approximately 100° C., for example, occurrence of failure such as deformation of a substrate is prevented. As a result, satisfactory heating treatment is carried out.

In the above producing method, during the process for producing a liquid crystal display element, it is preferable that heat treatment is given to the substrate stuck to the jig while being pressurized. For example, in the case where main calcination is given to the insulating film and the alignment film at a higher temperature, a difference in heat expansion and shrinkage coefficients between the substrate composed of thin glass, plastic, etc. and the jig (sticky layer, carrier), stress and distortion due to partial irregularity of a temperature occur because of rise in temperature to the calcination temperature and thereafter, drop in temperature to the normal temperature. This may cause bubbles between the substrate and jig, in some cases, peeling of the substrate from the jig, but the occurrence of bubbles is restricted by applying heat and pressure simultaneously, so the peeling of the substrate from the jig is prevented. As a result, for example, it is possible to raise treatment temperature and to obtain an alignment film, etc. whose orientation property is excellent, so performance and reliability of a liquid crystal display element can be improved.

For a fuller understanding of the nature and advantages of the invention, reference should be made to the ensuing detailed description taken in conjunction with the accompanying drawings.

DESCRIPTION OF THE EXAMPLES

Example 1

Figure 1:
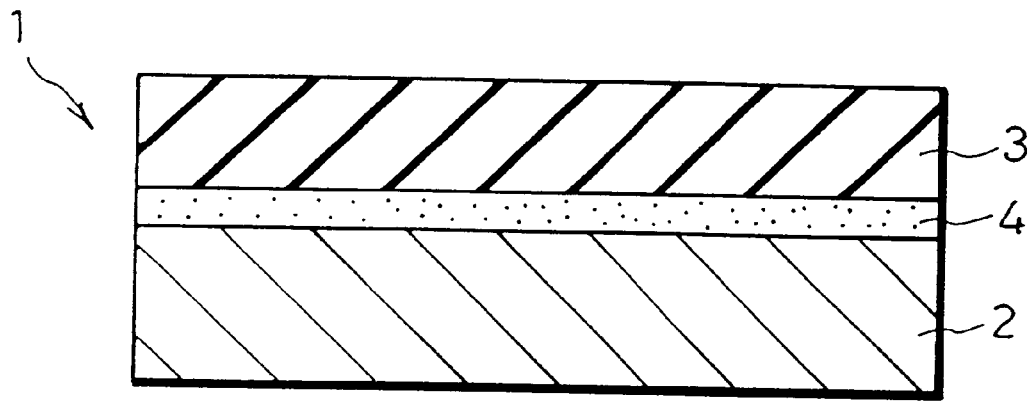
FIG. 1 is a schematic cross section which shows a substrate carrier jig according to one example of the present invention.
Figure 2:
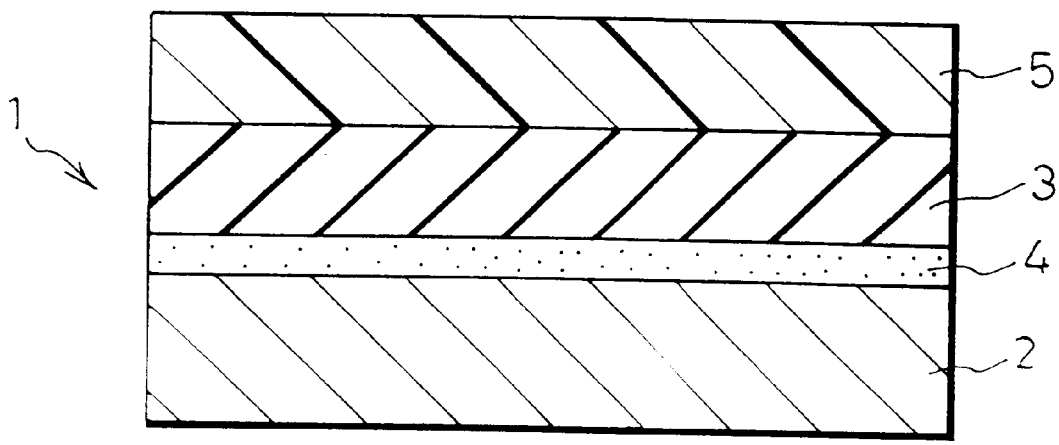
FIG. 2 is a schematic cross section which shows a state that a substrate is stuck to the substrate carrier jig.
Figure 3:
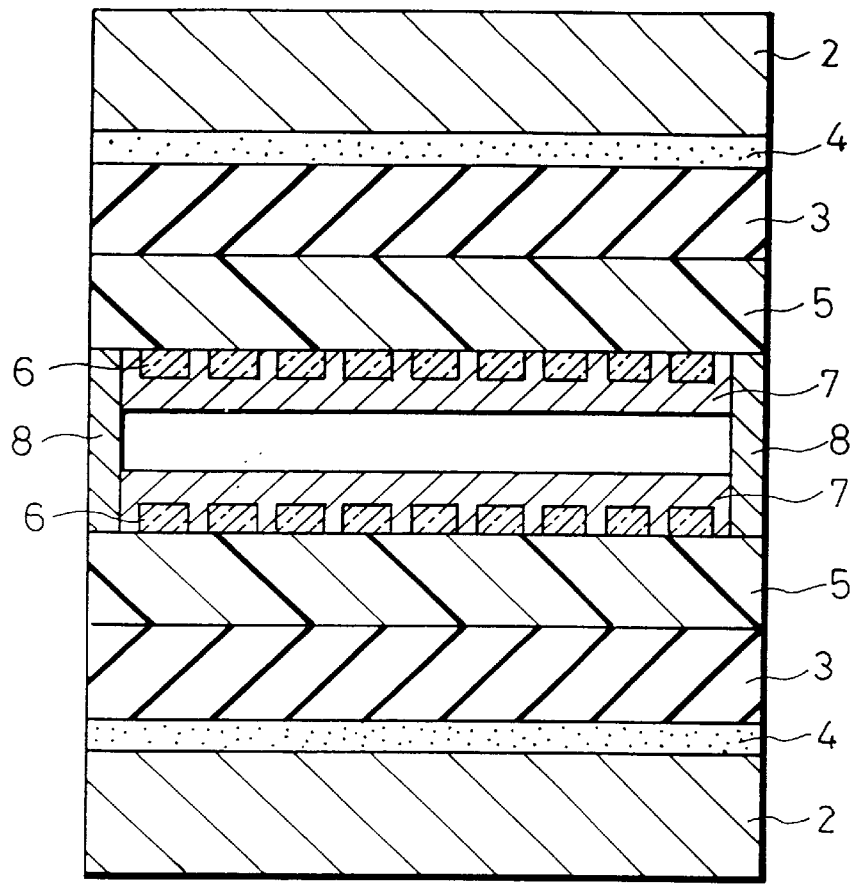
FIG. 3 is a schematic cross section which shows a process for laminating upper and lower substrates and a process for curing a sealing medium in a process for producing a liquid crystal display element using the substrate carrier jig.

Referring to FIGS. 1 through 3, the following description will discuss one example of the present invention.

As shown in FIG. 1, a substrate carrier jig 1 of the present invention (hereinafter, referred to as jig) is arranged so as to have a sticky layer 3 installed on a surface of a flat carrier 2.

The carrier 2 is composed of an epoxy-type resin plate whose thickness is 2 mm. As described later, the sticky layer 3 has a property that adhesion for retaining a substrate to be stuck on the surface of the sticky layer 3 is substantially maintained constant regardless of repeated use of the sticky layer 3. The sticky layer 3 having self-adhesion which can be repeatedly used, is composed of sheet-like silicone rubber whose surface is plain (thickness: 0.2 mm, hardness: 40°).

In order to permanently adhere the sticky layer 3 to the surface of the carrier 2, an adhesive material 4 (adhesive layer) composed of silicone-type resin was applied to the surface of the carrier 2 and the sticky layer 3 was adhered to the carrier 2 by means of the adhesive material 4 so that the jig 1 was made.

After a check was made on the jig 1 which was produced in the above manner that bubbles did not enter between the carrier 2 and the sticky layer 3, peeling adhesion was measured in a following manner. First, as described later, a test material was produced by cutting an acrylic-type resin plate (thickness: 0.4 mm) which was used as a substrate for a liquid crystal display element in a width of 20 mm to have a strip-like configuration, and the test material was pressurized against the surface of the sticky layer 3 by a roller so that the test material is stuck to the sticky layer 3. Thereafter, peel force at the time of peeling the test material from one of its end was measured as peeling adhesion. The peel force was repeatedly measured respectively at a normal temperature and after heating treatment at 100° C. for 3 hours in a sticking state (hereinafter, the measurement which was made by using the test material was referred to as a peel test).

As a result of the peel test, as to the jig 1 of the present example, the peel force was approximately 300 g at a normal temperature, and after the heating treatment, 300 g to 400 g. In both cases, the test material was easily peeled from the sticky layer 3 and the peeling adhesion did not increase or decrease due to repeated use, which provided excellent peeling adhesion properties.

Next, the following description will discuss using conditions of the jig 1 in a production line of a liquid crystal display element.

First, as shown in FIG. 2, a substrate 5 composed of acrylic-type resin which has a dimension of 300×324×0.4 mm was placed on the surface of the sticky layer 3 of the jig 1 and the surface was pressurized by a roller so that the substrate 5 was stuck to the sticky layer 3.

Successively, the jig 1 to which the substrate 5 was stuck was cleaned and was put into a magnetron sputtering device, not shown. Thereafter, an ITO transparent conducting film of 70 nm (700 Å) was formed on the substrate 5 at 80° C., and fine processes for patterning the transparent conducting film to a prescribed electrode pattern (resist application, light exposure, developing, etching, resist cleaning removal) were carried out.

Next, immediately after an alignment film in which uniform coating is required was printed by using an offset printer, temporary drying was carried out by using a hot plate at 100° C. for 3 minutes, and a main calcination treatment (100° C.—3 hours), a rubbing treatment and a cleaning treatment are given successively to the alignment film.

In addition, after a sealing medium was printed on one of a pair of substrates 5•5 which had been produced through the above processes and cell gap controlling bead was spread on the other substrate, the substrates 5•5 were stuck and the sealing medium was cured as shown in FIG. 3. FIG. 3, 6 shows a transparent conducting film electrode which was formed on the surface of the substrates 5•5, 7 shows an alignment film and 8 shows a sealing medium. Furthermore, a maximum treatment temperature condition through the above processes is 100° C. of a calcination temperature in the process for forming the alignment film.

As a result of proceeding the above processes with the substrate 5 stuck on the jig 1 and of observing the laminated substrates 5•5 with the produced jigs 1•1, an agent and water did not enter an interface between the substrate 5 and the sticky layer 3 of the jig 1, and remarkably bubbles did not occur.

Thereafter, the jigs 1•1 were peeled from the laminated substrates 5•5. In this case, with converted into a value per a width of 20 mm, the peeling adhesion was from 300 g to 400 g, which provided excellent releasability. The substrates 5•5 which were peeled from the jigs 1•1 were then cut to have a prescribed configuration, and successively, injection of liquid crystal and lamination of a deflecting plate were carried out so that a liquid crystal element was produced.

Whole stiffness increased because the substrates 5•5 from which the jigs 1•1 had been peeled were laminated to each other. As a result, it was possible that each substrate 5 was carried to each process with the substrate 5 peeled from the jig 1 and a liquid crystal element was made.

Meanwhile, after the jig 1 peeled from the substrate 5, went to the cleaning process of the sticky layer 3 and again was returned to the lamination process of a new substrate 5, the jig 1 was used for carrying the stuck substrate 5 to each producing process. Performance of the jig 1 which is repeatedly reused was not remarkably deteriorated even after the above cycle was repeated three times and more.

Example 2

Next, the following description will discuss another example of the present invention. Here, for convenience of explanation, those members of the present example that have the same arrangement and function, and that are mentioned in the above example are indicated by the same reference numerals and the description thereof is omitted. This is also applied to another examples described later.

A jig 1 of the present example is composed of soda glass whose carrier 2 has a thickness of 1.6 mm, and a sticky layer 3 is composed of butyl rubber (thickness: 0.5 mm, hardness: 40°) whose surface is plain. Furthermore, double-coated tape whose one side is acrylic-type and the other side is silicone-type is used as an adhesive material 4, and the sticky layer 3 is adhered to the surface of the carrier 2 by using the adhesive material 4.

In this case, similarly to example 1, bubbles did not enter between the sticky layer 3 and the carrier 2, and the results of the peeling test which is same as in example 1 were approximately 400 g at a normal temperature, and 400 g to 600 g after heating at 100° C. for 3 hours. This showed excellent peeling adhesion property.

A PES (Polyether sulphone) film which has a dimension of 300×324×0.1 mm as the substrate 5 was stuck on the jig 1 by a roller and was subject to the various processes same as in example 1. The substrate 5 was carried up to the rubbing process with the jig 1 stuck to the substrate 5. As a result of observation after the rubbing process, an agent and water did not enter the interface between the substrate 5 and the sticky layer 3, and remarkable bubbles did not occur.

When the jig 1 was peeled from the substrate 5, with the peeling adhesion converted into a value per width of 20 mm, the peeling adhesion was 300 g to 500 g. Therefore, releasability was excellent. The plastic substrate 5 after peeling was subject to the successive processes independently with it peeled from the jig 1 so that the liquid crystal element was produced. Meanwhile, after the jig 1 was subject to the cleaning process for the sticky layer 3, it was repeatedly reused, but in this case, its performance was not remarkably deteriorated even after undergoing 3 cycles of the processes.

Example 3

Similarly to example 2, soda glass whose thickness is 1.6 mm is used as a carrier 2, and a jig 1 is arranged so as to have the sticky layer 3 composed of a silicone rubber polymer on the carrier 2.

Prior to producing the jig 1, first, epoxy-type resin as an adhesive material 4 was applied to the carrier 2, and a 0.2 mm film of a silicone rubber monomer is applied thereto. Thereafter, the carrier 2 was gradually heated in order to slowly deaerate the silicone rubber monomer, and finally, polymerization of the sticky layer 3 composed of the silicone rubber at 100° C. for 4 hours and curing of the adhesive material 4 were performed so that the jig 1 was produced. As to the jig 1 made in such a manner, bubbles did not enter between the sticky layer 3 and the carrier 2, and as a result of the above-mentioned peeling test, the peeling adhesion was approximately 350 g at a normal temperature and was 300 g to 500 g after the heating at 100° C. for 3 hours, which provided an excellent peeling adhesion property.

An acrylic-type resin plate which has a dimension of 300×324×0.4 mm as the substrate 5 was stuck to the jig 1 by a roller and was subject to the various processes same as in example 2. The substrate 5 was carried up to the rubbing process with the jig 1 stuck to the substrate 5.

Here, during the above processes, the alignment film forming process was proceeded under the calcine condition of 120° C. and 2 hours after the alignment film was printed. Therefore, a maximum treatment temperature in this producing process is 120° C.

As a result of observing the substrate 5 stuck on the jig 1 after the completion of the alignment film forming process, an agent and water did not enter the interface between the substrate 5 and the sticky layer 3 and also bubbles did not remarkably occur.

Thereafter, the substrate 5 was carried up to the rubbing process with the jig 1 stuck to the substrate 5, and after a check was made that there did not exist any abnormality, the jig 1 was peeled. Here, when the jig 1 was peeled from the substrate 5, with the peeling adhesion converted to a value per width of 20 mm, it is 300 g to 500 g, which provided excellent releasability.

As mentioned above, the substrate 5 was independently carried to the subsequent processes so that the liquid crystal element was produced. The jig 1 was subject to the cleaning process for the sticky layer 3 and was reused. In this case, even after the jig 1 underwent three cycles of the processes remarkably, its performance was not deteriorated.

Examples 4

Similarly to example 3, soda glass whose thickness is 1.6 mm is used as a carrier 2, a jig 1 of the present example is arranged so as to have a sticky layer 3 composed of a silicone rubber polymer on the carrier 2. In this case, the process for applying a 0.2 mm film of epoxy-type resin as the adhesive material 4 and of silicone rubber monomer as the sticky layer 3 to the carrier 2, and the subsequent process for gradually heating the carrier 2 in order to slowly deaerate the silicone rubber monomer which were the same as in example 3 were performed. However, the final heating conditions were 100° C. and 4 hours in example 3 whereas in the present example, the heating conditions were set as at 170° C. and for 2 hours so that the jig 1 was produced.

Also in the present example, bubbles did not enter between the carrier 2 and the sticky layer 3 of the jig 1, and as a result of the peeling test, the peeling adhesion was approximately 330 g at a normal temperature and was 300 g to 500 g after heating at 100° C. and for 3 hours, which provided an excellent peeling adhesion property.

An acrylic-type resin plate which has a dimension of 300×324×0.4 mm as the substrate 5 was stuck to the jig 1 by a roller and underwent various processes under the same condition as in example 1. After the alignment film forming process (100° C. and 2 hours) was completed, the substrate 5 to which the obtained jig 1 was stuck was observed. As a result, an agent and water did not enter the interface between the substrate 5 and the sticky layer 3, and remarkably bubbles did not occur. Thereafter, as mentioned in the example 3, the substrate 5 with the jig 1 was carried up to the rubbing process, and after a check is made that there did not exist any abnormality, the jig 1 was peeled. Here, when the jig 1 was peeled from the substrate 5, the peeling adhesion was 300 g to 500 g with it converted into a value per width of 20 mm. Therefore, the releasability was excellent.

Comparative Example 1

A liquid crystal display element was produced by using the jig 1 of example 4 in the same manner as in example 4 except that the calcine condition at the alignment film forming process was changed. Therefore, the calcine condition at the alignment film forming method was set as at 120° C. and for 2 hours this time. After this process, as a result of observation of the substrate 5 with the obtained jig 1, an agent and water did not enter the interface between the substrate 5 and the sticky layer 3 of the jig 1, but since bubbles whose diameter is approximately 2 cm existed in several places, carrying to the processes was suspended at that time.

Example 5

Figure 4:
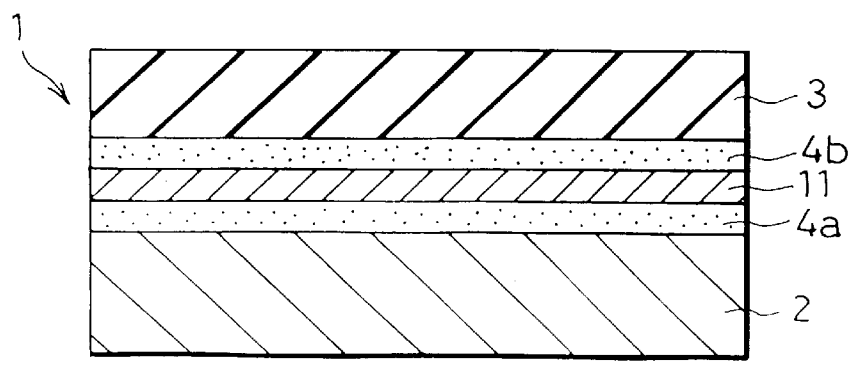
FIG. 4 is a schematic cross section which shows an example of the substrate carrier jig according to another example of the present invention.

As shown in FIG. 4, a jig 1 of the present example is arranged so as to further have an intermediate layer 11 between a carrier 2 composed of soda glass which has a thickness of 1.6 mm and a sticky layer 3 composed of silicone rubber whose surface is plain (thickness: 0.2 mm, hardness: 40°).

The intermediate layer 11 is composed of a PET film (thickness: 50 μm). A first adhesive material 4a composed of epoxy-type resin was applied to the carrier 2 so that the intermediate layer 11 was stuck to the surface of the carrier 2 by means of the first adhesive material 4a. Furthermore, a second adhesive material 4b composed of silicone-type resin was applied to the surface of the intermediate layer 11 so that the sticky layer 3 was stuck to the intermediate layer 11. Then, the jig 1 was produced.

In the jig 1 made in such a manner, bubbles did not enter between the sticky layer 3 and the carrier 2, and as a result of the aforementioned peeling test, the peeling adhesion was approximately 300 g at a normal temperature and was 300 g to 400 g after the heat treatment at 100° C. for 3 hours, which provided excellent peeling adhesion properties.

The substrate 5 composed of epoxy-type resin which has a dimension of 300×324×0.4 mm was stuck to the jig 1 by a roller. Thereafter, while the substrate 5 was undergoing various processes the same as in example 1, the conditions of the alignment film forming process was set so that the calcine was performed at 130° C. for 2 hours after the alignment film was printed. Here, a maximum treatment temperature through the process for producing a liquid crystal display element at that time was 130° C. After the alignment film forming process, as a result of observation of the substrate 5 with the obtained jig 1, an agent and water did not enter the interface between the substrate 5 and the sticky layer 3, and remarkably bubbles did not occur.

Thereafter, similarly to example 2, the substrate 5 with the jig 1 was carried up to the rubbing process, and after a check was made that there existed no abnormality, the jig 1 was peeled. Here, when the jig 1 was peeled from the substrate 5, the peeling adhesion was 350 g to 500 g with it converted into a value per width of 20 mm. Therefore, the releasability was excellent. The substrate 5 was independently carried to the subsequent processes so that a liquid crystal display element was produced. Meanwhile, the peeled jig 1 was subject to the cleaning process for the sticky layer 3 and was reused, but its performance was not remarkably deteriorated even after it was subject to three cycles of the processes.

Example 6

A jig 1 of the present invention is different from that of example 5 in that a second adhesive material 4b is composed of epoxy-type resin and that a sticky layer 3 is produced by polymerizing a silicone monomer.

As to the process for producing the jig 1, first, the second adhesive material 4b composed of the epoxy-type resin was applied to an intermediate layer 11 composed of the PET film (thickness: 50 μm) and a 0.2 mm film of a silicone rubber monomer was applied thereto. Thereafter, in order to moderately deaerate the silicone rubber monomer, the intermediate layer 11 was gradually heated, and finally, polymerization of the silicone rubber as the sticky layer 3 and curing of the second adhesive material 4b was carried out at 100° C. and for 4 hours.

Meanwhile, a first adhesive material 4a composed of the epoxy-type resin was applied to a carrier 2 composed of the soda glass whose thickness was 1.6 mm and the intermediate layer 11 with the sticky layer 3 which had been polymerized was adhered to the applied surface so that the jig 1 was produced.

As to the obtained jig 1, bubbles did not enter between the sticky layer 3 and the carrier 2 and as a result of the peeling test, the peeling adhesion was approximately 350 g at a normal temperature and was 300 g to 500 g after the heat treatment at 100° C. for 3 hours, which provided excellent peeling adhesion property.

The substrate 5 composed of epoxy-type resin which has a dimension of 300×324×0.4 mm was stuck to the jig 1 by a roller and a liquid crystal display element was produced in the same manner as in example 5. As a result of observation of the substrate 5 after the alignment film forming process (calcine at 130° C. for 2 hours after the printing of the alignment film) during the above processes, as mentioned above, an agent and water did not enter the interface between the substrate 5 and the sticky layer 3 and remarkably bubbles did not occur. Furthermore, when the jig was peeled after the rubbing process, the peeling adhesion was 350 g to 500 g with it converted into a value per width of 20 mm. Therefore, the releasability was excellent. Moreover, even after the peeled jig 1 was reused, its performance was not deteriorated.

Example 7

Similarly to the aforementioned example 1, a jig 1 of the present example is arranged so that a sticky layer 3 composed of sheet-like silicone rubber (thickness: 0.2 mm, hardness 40°) is adhered to a carrier 2 composed of the epoxy-type resin plate whose thickness is 2 mm by the adhesive material 4 made of silicone-type resin. However, the jig 1 of the present example is different from that of example 1 in that a sticky layer 3 has transmittance of an UV ray whose wave length is 365 nm is 50%. The sticky layer 3 is composed of silicone rubber. When the silicone rubber is prepared, pigment such as ZnO to be added is removed so as to color the sticky layer 3 white, and then the sticky layer 3 is produced.

As to the above jig 1, bubbles did not enter between the sticky layer 3 and the carrier 2, and as a result of the peeling test, the peeling adhesion was approximately 300 g at a normal temperature and was 300 g to 400 g after the heat treatment at 100° C. for 3 hours, which provided excellent peeling adhesion property.

The substrate 5 composed of the acrylic-type resin which has a dimension of 300×324×0.4 mm was stuck to the jig 1 by a roller. Then, after the substrate 5 was subject to each kind of the processes as mentioned in example 1, printing of a sealing medium, spreading of cell gap controlling bead, laminating of upper and lower substrates and curing of a sealing medium were carried out. In this case, a UV curing-type seal (made by Kyoritsu Chemical Industries Co., Ltd.) as the sealing medium 8 was used and when the upper and lower substrates 5•5 were laminated, an UV ray (a high-pressure mercury vapor lamp, 356 nm, 2J) was emitted from the both sides of the jigs 1•1. The substrate 5 was carried up to this process with it adhered to the jig 1.

Thereafter, after laminated substrates 5•5 with the jig 1 was observed so as to check that there existed no abnormality, the jig 1 was peeled. The peeling adhesion at this time was 300 g to 500 g with it converted into a value per width of 20 mm, so the releasability was excellent. Hereafter, a liquid crystal display element was produced by using the substrates 5•5 in the same manner as in the aforementioned example. Meanwhile, the peeled jig 1 was subject to the cleaning process and was reused, but even after it was subject to three cycles of the processes, its performance was not deteriorated.

Example 8

Figure 5:
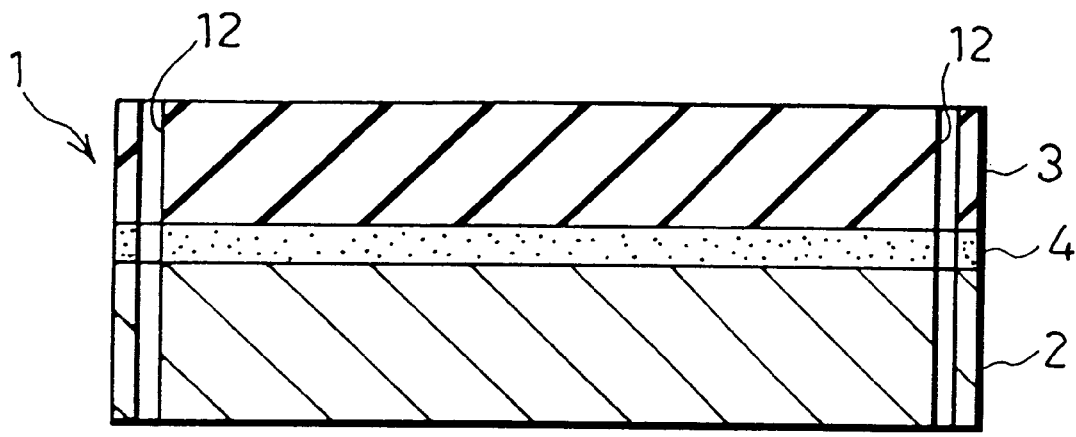
FIG. 5 is a schematic cross section which shows the substrate carrier jig according to still another example of the present invention.

In the same manner as in example 1, a jig 1 of the present example was produced by adhering a sticky layer 3 composed of sheet-like silicone rubber (thickness: 0.2 mm, hardness: 40°) to the carrier 2 composed of the epoxy-type resin plate whose thickness was 2 mm by means of an adhesive material 4 made of the silicone-type resin. Furthermore, as shown in FIG. 5, an alignment hole 12 (light transmitting section) which has a diameter of 3 mm was made in a place corresponding to a place of an alignment mark of an electrode pattern to be provided on the surface of a substrate 5.

As to the above jig 1, bubbles did not enter between the sticky layer 3 and the carrier 2, and as a result of the peeling test, the peeling adhesion was approximately 300 g at a normal temperature and was 300 g to 400 g after heating at 100° C. for 3 hours, which provided excellent peeling adhesion property.

A PES (polyether sulphone) film which has a dimension of 300×324×0.1 mm as the substrate 5 was stuck to the jig 1 by a roller. Then, after the substrate 5 was subject to each kinds of the processes in the same manner as in example 1, lamination of the upper and lower substrates 5 and curing of a sealing medium were carried out. The substrate 5 was carried up to this process with the plastic substrate 5 stuck to the jig 1.

In the above producing process, as to the processes after the transparent conducting film fine processing, since the provision of an alignment hole 12 in the place corresponding to the alignment mark section in the jig 1 results in no interference by a reflected light from thee surface of the sticky layer 3 in the jig 1, image recognition of the mark can be easily carried out. For example, in the process for laminating the upper and lower substrates, when the image recognition of the alignment mark was carried out in accordance with the alignment hole 12 on the jig 1 side, excellent recognizing coefficient was obtained.

After the above processing, a check was made that there existed no abnormality due to the provision of the alignment hole 12 in the jig 1, and the jig 1 was peeled. Here, the peeling adhesion at the time of peeling the jig 1 from the plastic substrate 5 was 200 g to 400 g with it converted into a value per width of 20 mm, so releasability and repeatability of the jig were as excellent as in example 1.

Example 9

A soda glass plate which has a dimension of 300×324×0.55 mm as a substrate 5 for a liquid crystal display element was stuck to the jig 1 by a roller, and the substrate with the jig 1 was subject to each kinds of the processes for the liquid crystal display element as mentioned above so that a liquid crystal display element was produced.

In this case, as a result of observation of the upper and lower substrates 5•5 after their lamination, an agent and water did not enter the interface between the glass substrate 5 and the sticky layer 3 of the jig 1, and remarkably bubbles did not occur.

In addition, when the jig 1 was peeled from the both laminated thin sheet glass substrates 5•5, the peeling adhesion was 300 g to 450 g with it converted into a value per width of 20 mm, so its releasability was excellent. Stiffness of the substrates 5•5 which is composed of the laminated thin sheet glass peeled from the jig 1 increased wholly because of their lamination. As a result, the substrate 5 was carried to subsequent processes for scissioning, injecting liquid crystal and sticking a deflecting plate with the substrate removed from the jig 1 so that a liquid crystal display element can be produced. Meanwhile, even after the peeled jig 1 was reused from the process for sticking the substrate 5 as mentioned above, its performance was not deteriorated.

Example 10

A substrate 5 composed of acrylic-type resin which has a dimension of 300×324×0.4 mm was stuck to a jig 1 of the example 1 by a roller and while being subject to each kinds of the processes, the condition of the process for forming the alignment film was set as 140° C., $2.0 \times 10^5$ Pa (2 kgf/cm$^2$) and 1.5 hours so that the substrate with the jig 1 was calcined with it pressurized by air after the alignment film was printed.

After the process for forming the alignment film, as a result of observation of the substrate 5 with the obtained jig 1, there existed no abnormality. Successively, after the rubbing process, the substrate 5 stuck on the jig 1 was carried up to the processes for laminating the upper and lower substrates and for curing a sealing medium. Thereafter, the laminated substrates 5•5 were observed and a check was made that there existed no abnormality so that the jig 1 was peeled. The peeling adhesion at this time was 350 to 600 g with it converted into a value per width of 20 mm, so its releasability was excellent. Releasability and repeatability of the jig were as excellent as in example 1.

Comparative Example 2

A substrate 5 was subject to each kind of the processes under the same conditions as in example 10 except that the condition of the alignment film forming process was set to 140° C., atmospheric pressure and for 1.5 hours, and the plastic substrate 5 with the obtained jig 1 was observed after the alignment film forming process. As a result, an agent and water did not enter the interface between the substrate 5 and the sticky layer 3, but many bubbles whose diameter was 2 cm were found. Therefore, carrying to the processes was suspended at this stage.

Comparative Example 3

Figure 6:
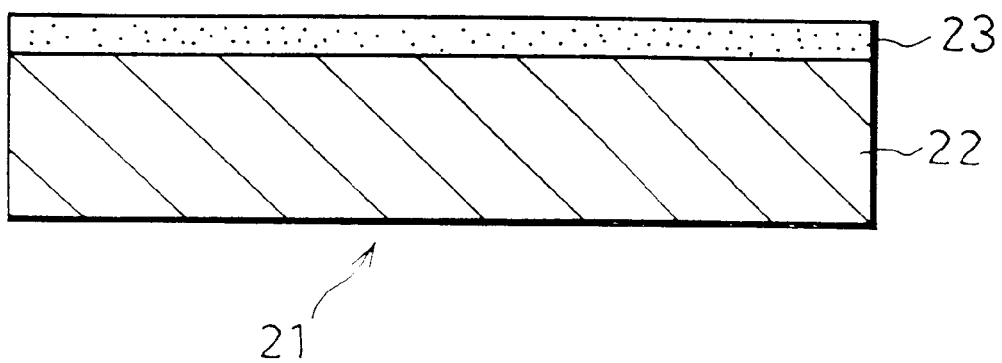
FIG. 6 is a schematic cross section which shows the substrate carrier jig of comparative examples.

As shown in FIG. 6, double-coated tape (No. 5915) made by Nitto Electric Industrial Co., Ltd. as a sticky layer 23 was adhered to a carrier 22 composed of soda glass whose thickness was 1.6 mm so that a jig 21 for comparison was produced. Since bubbles did not enter between the carrier 22 and the sticky layer 23, the jig for comparison 21 had an excellent appearance, but the acrylic-type plastic substrate had adhesion which makes peeling difficult (approximately 900 g per width of 20 mm) at a normal temperature. Furthermore, when the surface state of the sticky layer 23 on the plastic substrate peeling section was observed, it was found that the adhesion was substantially changed, so it was judged that the jig was defective also in the point of reuse. Note that, after heating at 100° C. for 3 hours, the peeling adhesion further increased, so peeling was impossible.

Comparative Example 4

As to the sticky layer 23 in the comparative example 3, the double-coated tape (No. 5915) made by Nitto Electric Industrial Co., Ltd. was changed to a double coated tape (#4594HL) made by Sumitomo 3M company so that the jig 21 for comparison was produced. Since bubbles did not enter between the carrier 22 and the sticky layer 23 and an acrylic-type plastic substrate had a slightly weak adhesion (approximately 30 g per width of 20 mm), the jig 21 obtained excellent peeling workability. However, bubbles occurred on the interface between the plastic substrate and the sticky layer 23 in the heat treatment at 100° C. for 3 hours.

The results of examples 1 through 10 and the comparative examples 1 through 4 are shown in Table 1.

TABLE 1

| | Jig construction and evaluation | | | | Evaluation in Process for Producing Liquid Crystal Display Element | | | |
|---|---|---|---|---|---|---|---|---|
| | Jig construction | | | Normal temperture/Adhesion after 100° C. 3H heating | Evaluation | Substrate | ITO Process | Process for forming orientation film (Calcine temperature, pressure) | Laminating process |
| | Carrier | Intermediate layer | Sticky layer | | | | | | |
| Example 1 | Epoxy resin | None | Silicone rubber Hardness: 40° | 300/300–400 | ○ | Acrylic resin | ○ | ○(100° C., atmospheric pressure) | ○ |
| Example 2 | Soda glass | None | Butyl rubber | 400/400–600 | ○ | PES film | ○ | ○(100° C., atmospheric pressure) | — |
| Example 3 | " | None | 100° C. polymerization of silicone rubber | 350/300–500 | ○ | Acrylic resin | ○ | ○(120° C., atmospheric pressure) | — |
| Example 4 | " | None | 170° C. polymerization of silicone rubber | 330/300–500 | ○ | " | ○ | ○(100° C., atmospheric pressure) | — |
| Comparative Example 1 | (Same as example 4) | | | | ○ | " | ○ | *(120° C., atmospheric pressure) | — |
| Example 5 | " | PET film | Silicone rubber Hardness: 40° | 300/300–400 | ○ | Epoxy resin | ○ | ○(130° C., atmospheric pressure) | — |
| Example 6 | " | PET film | 100° C. polymerization of silicone rubber | 350/300–500 | ○ | " | ○ | ○(130° C., atmospheric pressure) | — |
| Example 7 | (Same as example 1) + Transmittance of UV ray: 50% | | | 300/300–400 | ○ | Acrylic resin | ○ | ○(100° C., atmospheric pressure) | ○ |
| Example 8 | (Same as example 1) + Making of alignment hole | | | 300/300–400 | ○ | PES film | ○ | ○(100° C., atmospheric pressure) | ○ |
| Example 9 | (Same as example 1) | | | | ○ | Soda glass | ○ | ○(100° C., atmospheric pressure) | ○ |
| Example 10 | (Same as example 1) | | | | ○ | Acrylic resin | ○ | ○(140° C., pressurizing) | ○ |
| Comparative Example 2 | (Same as example 1) | | | | ○ | " | ○ | *(140° C., atmospheric pressure) | — |
| Comparative Example 3 | Soda glass | Double-coated tape (Acrylic adhesive material) | | 900/Impossible to peel | x | | | | |
| Comparative Example 4 | " | Double-coated tape (Acrylic adhesive material) | | 30/Bubbles occur on interface | Δ | | | | |

1) The adhesive was measured by using an acrylic resin substrate whose width is 20 mm.
2) Symbols—○: Excellent, x: Strong adhesion, Δ: Weak adhesion so cannot be used at heating process, *: Bubbles occur on the adhesive interface, —: Not evaluated.

Next, the following will discuss evaluated results of a using state of the jig in the process for forming the alignment film, subdividing the process for forming the alignment film into a printing process, a temporary drying process and a main calcination process.

For example, as shown in Table. 2, the above-mentioned example 1 is arranged so that the sticky layer 3 made by silicone rubber is provided on the carrier 2 composed of an epoxy-type resin plate. The substrate 5 composed of acrylic-type resin plate is stuck to the jig 1, and the jig 1 to which the substrate 5 was stuck is carried out through a producing line of a liquid crystal display element. As mentioned above, after a process of forming a transparent conducting coat (ITO process), first, the alignment film is printed by using an offset printer, and immediately after that, temporary drying is carried out by using the hot plate at 100° C. for 3 minutes.

Thereafter, main calcination is carried out at 100° C. for 3 hours so that the alignment film is formed on the substrate.

At the time of printing the alignment film at this time, failure, such as catching of the plastic substrate 5 by a print roller, irregularity of printing due to an absorption hole and a channel in a printing stage, did not occur, so satisfactory printing could be secured. Moreover, also at the time of temporary drying and main calcination, failure, such as dance-like movement and deformation of the plastic substrate 5 due to heating, peeling of the plastic substrate 5 from the jig 1 or occurrence of air bubbles in the interface between the plastic substrate 5 and the sticky layer 3, does not occur, so excellent states of temporary drying and main calcination can be secured.

with the jig after the completion of the main calcination process, agent and water did not enter the interface of the plastic substrate and the jig sticky material, but as mentioned above, many of air bubbles with a diameter of approximately 2 cm were found.

In the case where a calcination temperature is high, it is effective that calcination is carried out while the pressurizing is being carried out likewise the example 10. Moreover, the following will discuss an appropriate pressurizing condition at the time of heating to a higher temperature, referring to an example 11 and a comparative example 5.

Example 11

As the substrate 5 of a liquid crystal display element, an acrylic-type resin substrate with a thickness of 300×324×0.4

TABLE 2

| | Jig construction | | | ITO | Process for forming alignment film | | | Rubbing- Laminating |
| --- | --- | --- | --- | --- | --- | --- | --- | --- |
| | Carrier | Sticky layer | Substrate | Process | Print | Temporary drying | Main Calcination (Calcining temperature, pressure) | process |
| Example 1 | Epoxy resin | Silicone rubber | Acrylic resin | ○ | ○ | ○ | ○(100° C., atmospheric pressure) | ○ |
| Example 2 | Soda glass | Butyl rubber | PES film | ○ | ○ | ○ | ○(100° C., atmospheric pressure) | — |
| Example 9 | (Same as example 1) | | Soda glass | ○ | ○ | ○ | ○(100° C., atmospheric pressure) | ○ |
| Comparative Example 2 | (Same as example 1) | | | ○ | ○ | ○ | x(140° C., atmospheric pressure) | — |
| Example 11 | (Same as example 1) | | | ○ | ○ | ○ | ○(150° C., FIG. 7) | ○ |
| Comparative Example 5 | (Same as example 1) | | | ○ | ○ | ○ | x(150° C., FIG. 8) | — |
| Comparative Example 6 | (Same as example 1) | | PES film | ○ | x | x | — *) Use jig until ITO process | — |

*) Symbols—○: Excellent, x: Failure occurs, —: Not evaluated

Meanwhile, as to the above-mentioned example 2, the jig 1 is arranged so that the sticky layer 3 made by butyl rubber was provided on the carrier 2 composed of soda glass. As the substrate 5, the PES (Polyether sulphone) film which has a dimension of 300×324×0.1 mm was stuck to the jig, and the jig to which the PES film was stuck was carried through the producing line of the liquid crystal display element. Moreover, as to the example 9, the substrate 5 made by a soda glass plate was stuck to the jig 1 in the same manner as the example 1, and the jig 1 to which the substrate 5 was stuck was carried through the producing line of the liquid crystal display element.

Also as to the examples 2 and 9, similarly to example 1, in the processes for printing an alignment film temporary drying and main calcining, failure, such as catching of a substrate by the print roller, dance-like movement and deformation of the substrate at the time of heating, peeling of the plastic substrate from the jig, air bubbles at an interface of a plastic substrate and a jig sticky material, did not occur, so satisfactory state could be secured.

Here, the comparative example 2 shown in table 2 was carried through each kind of processes under the same condition as the example 1 except that a main calcining condition was 140° C. and 1.5 hours.

In this case, at the time of printing the alignment film, failure, such as catch of the plastic substrate by the print roller, irregularity of printing due to the absorption hole and groove in the printing stage, did not occur, so satisfactory printing could be carried out. Furthermore, also at the time of temporary drying, failure, such as dance-like movement and deformation of the plastic substrate due to heating, did not occur, so satisfactory temporary drying could be carried out. However, as a result of observing the plastic substrate mm as the substrate 5 was stuck to the jig 1 of the example 1 by a roller, and a liquid crystal display element was produced in the same manner as the example 1 in which only the main calcining condition in the process for forming the alignment film was changed.

Figure 7:
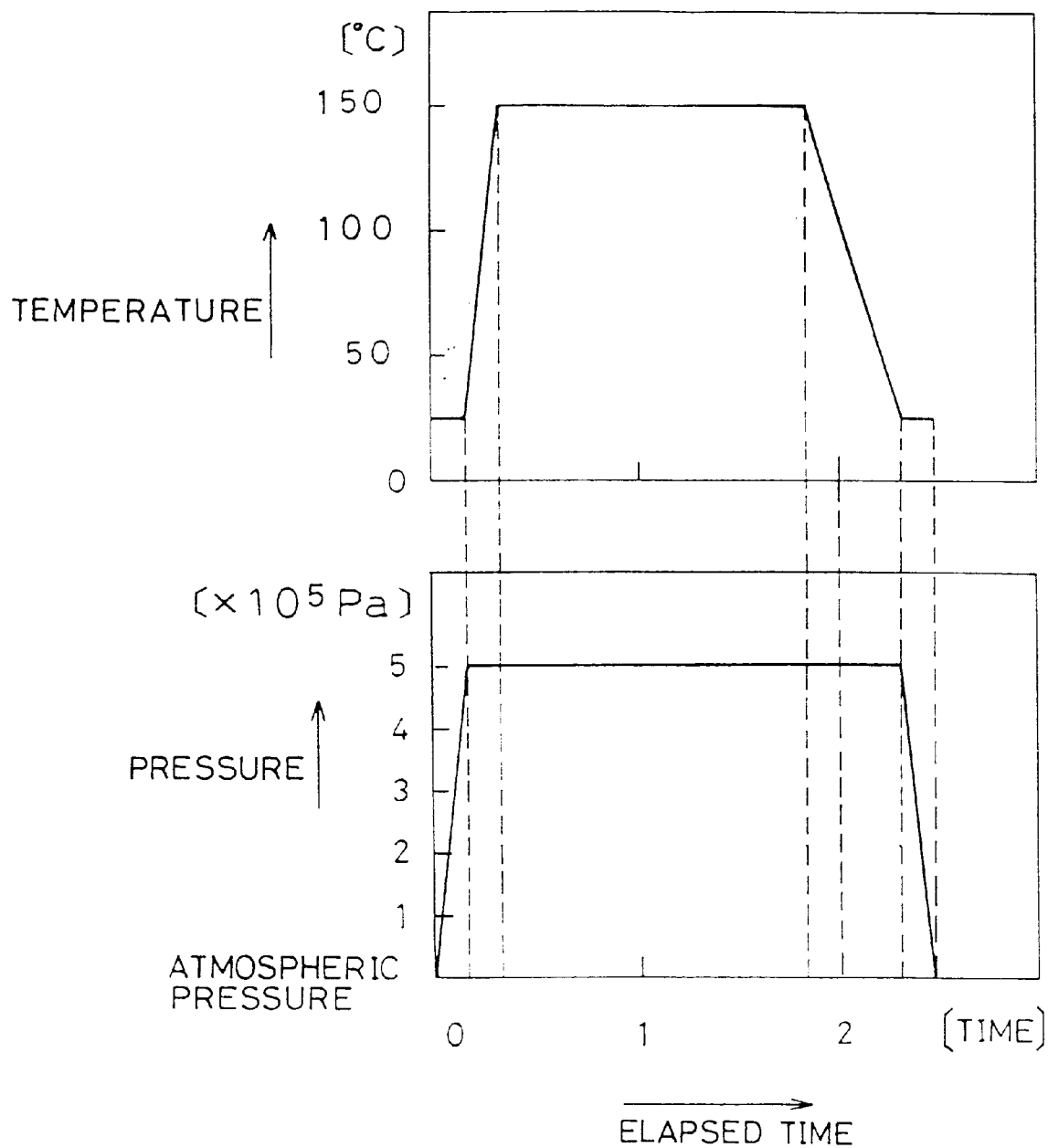
FIG. 7 is a graph which shows a time change in conditions of heating and pressure at the time of main calcination in a process for forming an alignment film of a liquid crystal display element in still another example of the present invention.

FIG. 7 shows the main calcining condition in the process for forming the alignment film at this time. As shown in the drawing, first, a pressure was allowed to rise to $5.0 \times 10_5$ Pa (5 kgf/cm$^2$), and then heating was started. Thereafter, calcination was carried out at 150° C. and for 1.5 hours, and after that, a temperature was lowered to a room temperature while the above pressurizing state was being maintained. Thereafter, the pressure state is allowed to return to an atmospheric pressure.

Since the main calcination was carried out by a program control under the above conditions of the pressure and the temperature, failure, such as dance-like movement and deformation of the substrate at the time of heating and cooling in the calcination process, peeling of the plastic substrate from the jig, air bubbles at the interface of the plastic substrate and the jig sticky material, did not occur, so satisfactory state could be secured.

Thereafter, the plastic substrate stuck to the jig was carried up to the rubbing process, the process for laminating the upper and lower substrates and the process for curing sealing medium so that a liquid crystal display element was produced. At this time, the plastic substrate stuck to the jig was observed so as to make sure that there exist no particular abnormality, and the jig was peeled.

Here, peeling adhesion at the time of peeling the jig from the plastic substrate was 350 g to 600 g for a width of approximately 20 mm, which provides satisfactory peeling. Moreover, both releasability and repeatability of the jig were excellent likewise the example 1.

Comparative Example 5

Figure 8:
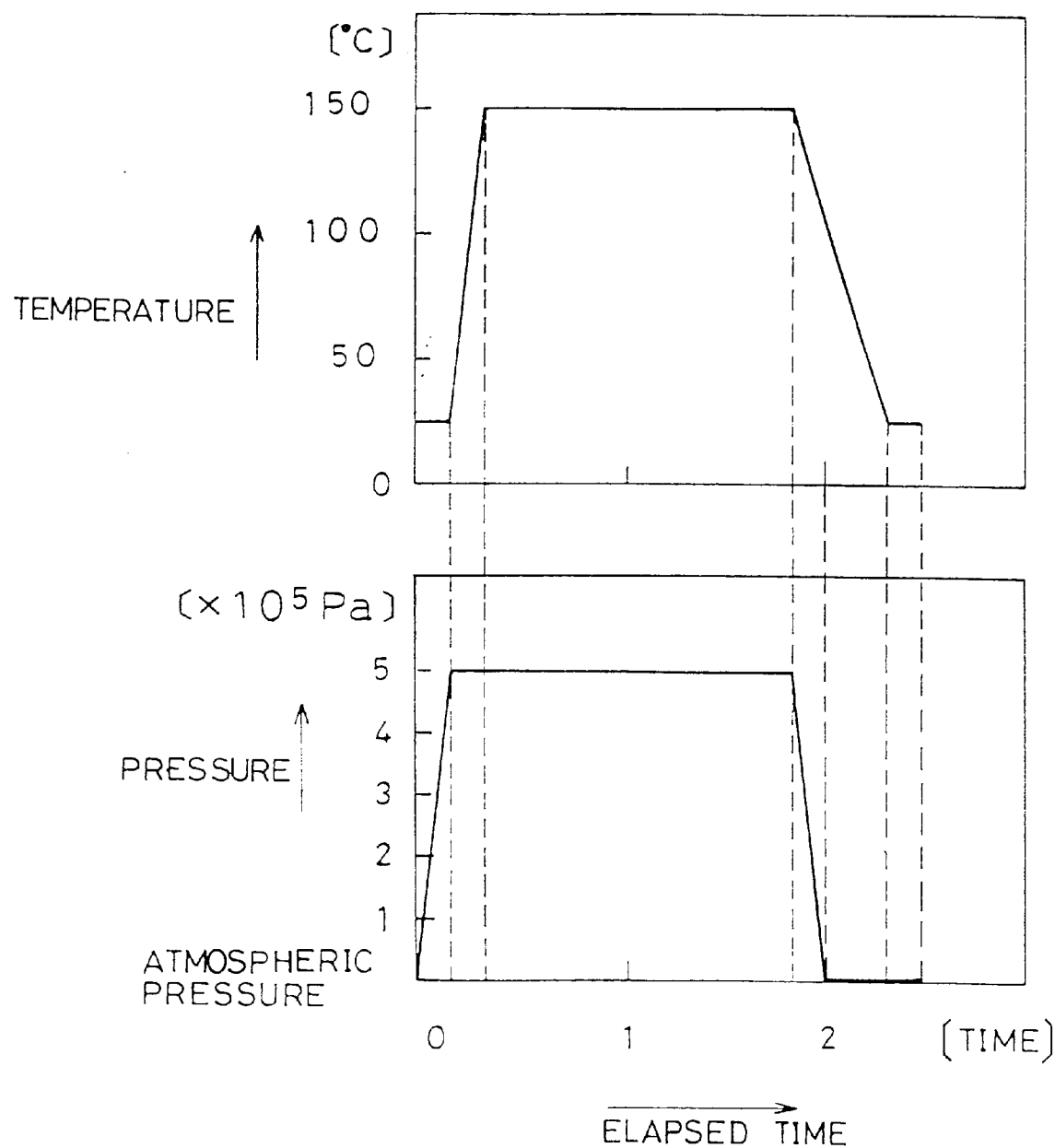
FIG. 8 is a graph which shows a time change in conditions of heating and pressure at the time of main calcination in a process for forming an alignment film of a liquid crystal display element in another comparative example.

Only the condition of main calcination of the alignment film in the example 11 was changed so that a liquid crystal display element was produced. The conditions at this time is shown in FIG. 8. As shown in FIG. 8, heating was started after rise in the pressure, and the calcination was carried out at 150° C. and for 1.5 hours under pressure of $5.0 \times 10_5$ Pa in the same manner as the example 11. Thereafter, conditions that the pressure state is returned to an atmospheric pressure and simultaneously a temperature is lowered to a room temperature were adopted.

When the plastic substrate with the jig after the completion of the process for forming the alignment film was observed, agent and water did not enter the interface of the plastic substrate and the jig sticky material. However, since many of air bubbles with a diameter of about 2 cm were found, the carrying was suspended at this stage.

Next, the following will discuss a result that as a comparative example 6, a substrate was removed from a jig before the process for forming an alignment film and the alignment film was formed as a single substrate.

Comparative Example 6

As the plastic substrate, a PES (Polyether sulphone) film substrate which has a dimension of 300×324×0.1 mm was stuck to the jig of the example 1 by a roller.

Next, in the same manner as the example 1, after the jig to which the plastic substrate was stuck was cleaned, it was put into a magnetron sputtering device, and an ITO transparent conducting film of 70 nm (700 Å) was formed on the plastic substrate at a temperature of 80° C. Thereafter, the jig to which the plastic substrate was stuck was carried up to the transparent conducting film fine processes (resist application, light exposure, developing, etching, resist clearing removal).

As a result of observing the plastic substrate with the jig at this stage, it was found that agent and water did not enter the interface of the plastic substrate and the jig sticky material, and remarkably air bubbles did not occur. Then, the substrate was removed from the jig at this stage.

Thereafter, the plastic substrate which was removed from the jig was installed to a stage of an offset printer for printing an alignment film by a hand and was retained by absorption so that printing was carried out. At this time, there occurs a failure that the plastic substrate was partially caught by the print roller, and irregularity of printing having a configuration of an absorption channel in the stage of the printer. Moreover, at the time of temporary drying immediately after printing, since the plastic substrate showed dance-like movement on a hot plate and partial irregularity of drying occurs, the carrying was suspended at this stage.

As explained above, in each example, the jig 1, which is arranged so as to have the sticky layer 3 which is repeatedly reusable on the carrier 2 having constant stiffness, is used for producing a liquid crystal display element. In this case, the substrate 5 composed of a thin sheet glass plate, a plastic plate, etc. is stuck to the jig 1, and the substrate 5 stuck to the jig 1 is carried to each process. Then, the substrate 5 is peeled from the jig 1. The jig 1 from which the substrate 5 has been peeled was returned to the process for sticking a new substrate 5 so as to be reused.

This makes it possible to constantly produce a liquid crystal display element in which a thin sheet glass substrate and a plastic substrate are used, which was hard to be produced in the past. Moreover, the jig 1 was obtained by forming the sticky layer 3 whose peeling adhesion is substantially kept constant after repeated use on the carrier 2. As a result of capability of repeatedly using the jig 1, cost of producing a liquid crystal display element can be reduced greatly compared to the conventional disposable jig.

In addition, a conventional producing device for a glass-type liquid crystal display element can be commonly used, so investment in plant and equipment in connection with development or remodeling of new equipment can be greatly cut down.

Here, as mentioned in example 4 and comparative example 1, it is desirable that the sticky layer 3 is formed on the carrier 2 at a temperature of not more than 100° C. In other words, as a temperature at the time of forming the sticky layer 3 is lower, residual stress and distortion due to a difference in thermal expansion coefficients between the sticky layer 3 and the carrier 2 becomes smaller during change in temperature which is around a normal temperature. For this reason, in the case where a thin sheet glass substrate and a plastic substrate are stuck on the sticky layer 3 of the jig 1 at a normal temperature, stress and distortion due to differences in thermal expansion coefficients between the substrate 5 and the sticky layer 3 and between the substrate 5 and the carrier 2 can prevent the substrate 5 from peeling from the sticky layer 3 during subsequent change in a temperature.

This makes it possible to further raise a maximum service temperature in the process for sticking a thin sheet glass substrate and a plastic substrate on a jig. As a result, excellent alignment film whose orientation properties are excellent can be obtained, so performance and reliability of a liquid crystal display element are improved.

Meanwhile, as mentioned in examples 5 and 6, as to the jig 1 which is provided with the intermediate layer 11 between the carrier 2 and the sticky layer 3, even in the case where a great difference in thermal expansion coefficients exists between the carrier 2 and the sticky layer 3, the thermal expansion coefficient of the intermediate layer 11 is set between the thermal expansion coefficients of the carrier 2 and the sticky layer 3 so that stress and distortion due to a difference in a thermal expansion coefficient caused by change in temperature are relaxed by the intermediate layer 11.

In addition, as explained in example 6, in the case where the sticky layer 3 is preliminarily formed on the intermediate layer 11 and the intermediate layer 11 with the sticky layer 3 is adhered to the carrier 2, the sticky layer 3 can be formed thinner. This further restrains expansion stress of the sticky layer 3 at the heat treatment, so adhesion of the substrate 5 on the jig 1 is improved.

Moreover, compared to the process for producing a jig that a separately produced thin sticky layer is directly adhered to a carrier, the process for producing the jig that the sticky layer 3 is preliminarily formed on the intermediate layer 11 as mentioned above can improve adhesion workability to the carrier 2 and can reduce cost of producing the jig.

Meanwhile, as mentioned in example 7, in the case where the jig 1 is produced so that at least 30% or more of or preferably 50% or more of an UV ray whose wavelength is 365 mm can penetrates, the UV ray can be irradiated to the thin sheet glass or plastic substrate 5 through the jig 1. As a result, an UV response-type sealing medium can be used, for example, in the process for laminating the upper and lower substrates in the sequence of the processes for producing a liquid crystal display element. The UV response-type sealing medium does not require for a high temperature condition at the time of cure of sealing. As a result, it is possible to cure sealing at a temperature which is close to a normal temperature. For this reason, when a temperature is lowered to a normal temperature after cure of sealing, shrinkage stress on the thin sheet glass or plastic substrate 5 and stress on a sealing medium are decreased greatly compared to a conventional thermoset sealing medium. This improves performance and reliability of a liquid crystal display element.

Here, in the case where the transmittance of the UV ray whose wavelength is 365 nm is less than 30%, since a time to obtain a necessary light amount for curing a sealing medium becomes long, productivity is lowered. Furthermore, problems such that a service life of a jig is lowered due to deterioration of the sticky layer 3, deformation stress occurs due to a rise in temperature, cost is increased due to enlargement of a UV irradiating device.

In addition, as mentioned in example 8, a reflected interference light from the surface of the jig 1 is restrained by providing the alignment hole 12 on an alignment mark section of an electrode pattern to be formed on the substrate 5, and it is possible to carry out a high-accurate automatic positioning by means of an image recognition method using the alignment mark with the substrate 5 stuck to the jig 1. In such a manner, when transmittance of a visible ray to a section corresponding to the alignment mark of the electrode pattern is partially increased, the positioning accuracy in the subsequent sequence of the producing processes is improved. Therefore, a liquid crystal display element whose display quality is excellent can be produced.

Meanwhile, as is clear from each example and comparative example 6, in an offset printing process of an insulating film, an alignment film, etc. which requires uniform printing, catching by a print roller and deformation along an absorption hole and a channel, which are liable to occur in the case of particularly a plastic substrate, can be reduced by providing higher rigidity to a carrier of a jig, thereby obtaining excellent printing. Moreover, also when temporary drying is carried out immediately after printing of an alignment film, for example, dance-like movement of a plastic substrate due to heat on a hot plate is prevented, thereby obtaining excellent drying.

Furthermore, as mentioned in example 10, comparative example 2 and example 11, in calcine treatment for the insulating film and alignment film which requires higher processing temperature, bubbles occur due to differences in the thermal expansion and shrinkage coefficients between the substrate 5 and the sticky layer 3 and between the the substrate 5 and carrier 2 of the jig 1, and due to stress or distortion caused by partial temperature irregularity, and this makes it easy that the substrate 5 is peeled from the jig 1. However, at this time, the occurrence of bubbles is restrained by carrying out heating and pressurizing simultaneously, thereby resulting in that the peeling of the substrate 5 from the jig 1 is prevented.

As mentioned especially in example 11 and comparative example 5, temperature of the substrate and jig reaches to calcining temperature environment. Moreover, in a process that the temperature falls to normal temperature, occurrence of bubbles between the substrate and the jig and a force which peels the substrate from the jig can be further surely prevented by synchronizing a pressurizing—reduced pressure program with a heating—cooling program of a calcining oven under a constant condition.

As a result, for example, processing temperature at the time of forming an alignment film can be set high, thereby making it possible not only to increase performance, uniformity and reliability of alignment in liquid crystal molecule but also to improve performance and reliability of a liquid crystal element. Moreover, in the above examples, a forming process of the insulating film is omitted, but similarly to the process of forming an alignment film, the insulating film can be formed by the processes for offset printing, temporary drying and main calcination. The insulating film is formed between the transparent electrode and the alignment film, but its insulating performance is increased by carrying out the main calcining at high processing temperature, and the performance and the reliability of the liquid crystal display element can be improved.

The present invention is not limited to the above examples, so various changes are acceptable in the scope of the present invention. In the above examples, a thin sheet glass plate, an acrylic-type resin plate, a PES (polyether sulphone) film and epoxy-type resin were used as the substrate 5 which is carried to the processes by using the jig 1, but a substrate composed of polysulfone, polyarylate, polycarbonate, polyester, maleimide resin, etc. can be used as another plastic substrate. Moreover, as an adhesive material used for adhesion among the carrier 2, the sticky layer 3 and the intermediate layer 11, various kinds of adhesive materials such as sticky type, normal-temperature-curing type, heat-curing type, response-to-water type can be used.

As described above, the substrate carrier jig of the present invention is a jig, which is carried through processes while supporting a substrate of a liquid crystal display element on its surface, and it is arranged so that a sticky layer in which adhesion for holding the substrate to be stuck to the surface is kept substantially constant even after repeated use is provided on a carrier.

As a result, the substrate of a liquid crystal display element is stuck to the substrate carrier jig of the present invention and the jig is carried through the sequence of the process for producing a liquid crystal display element so that the substrate stuck to the jig is subject to liquid crystal display element forming treatments successively. Then, after the predetermined processes, the substrate is peeled from the jig, and a liquid crystal display element can be produced by reusing the jig for sticking a new substrate.

As a result, even if substrate materials such as thin sheet-like glass, plastic which independently have no strength and stiffness are used, a liquid crystal display element can be produced by means of conventional glass liquid crystal display element producing line by carrying a thin sheet glass substrate or a plastic substrate, etc. stuck on the jig to the processes for producing a liquid crystal display element. Furthermore, since the jig can be reused, it can greatly reduce the cost of producing a liquid crystal display element compared to a disposable jig.

When the intermediate layer is provided between the carrier and the sticky layer, stress and distortion due to a difference in a thermal expansion coefficients caused by a change in temperature are relaxed at the intermediate layer by setting the thermal expansion coefficient of the intermediate layer between the thermal expansion coefficients of the sticky layer and the carrier. Moreover, the jig is produced such that the sticky layer is preliminarily formed on the intermediate layer and the intermediate layer with the sticky layer is adhered to the carrier, so that the sticky layer can be formed thinner. As a result, expansion stress on the sticky layer in the heat treatment is restrained and adhesion of the substrate to the jig is improved. In the case where the sticky layer is preliminarily formed on the intermediate layer, adhesion workability to the carrier is improved and the cost of producing the jig can be restrained.

When the light transmitting section for improving transmittance of visible light is provided in a place corresponding to the alignment mark of the electrode pattern formed on the substrate, the substrate stuck to the jig can be positioned by using the alignment mark in each process for producing a liquid crystal display element. As a result, the highly accurate positioning can be carried out by using an automatic image recognition method, and a liquid crystal display element whose display quality is excellent can be produced.

The method of producing the liquid crystal display element of the present invention is arranged so that a printing process for an insulating film, an alignment film, etc. is carried out with a substrate stuck to the jig.

This arrangement restrains deformation along an absorption hole and a channel at a printing state which is liable to occur especially in the case of a plastic substrate, so excellent printing can be obtained and at the same time, catching of the plastic substrates by a print roller at the time of printing can be also prevented.

In the above producing method, in the case where a process for calcining the insulating film and the alignment film is carried out with the substrate stuck to the jig, when temporary drying and calcining at comparatively low temperature are carried out in the process for forming the insulating and the alignment film, occurrence of defects such as dance-like movement of the plastic substrate and deformation of the substrate due to heat on a hot plate is prevented, thereby making it possible to provide excellent heat processing.

In the above producing method, in the case where the substrate stuck to the substrate carrier jig is heated while being pressurized during the process for producing a liquid crystal display element, for example, when calcine treatment in the process for forming the insulating film and the alignment film is carried out, a difference in the thermal expansion and shrinkage coefficients between the thin sheet glass substrate or the plastic substrate and the jig, and occurrence of bubbles between the substrate and the jig due to stress and distortion caused by partial irregularity of a temperature can be surely restricted. As a result, it is possible to set a treatment temperature higher, for example, and an insulating film with excellent insulating characteristics, an alignment film with excellent aligning characteristics, etc. can be obtained, thereby making it possible to improve performance and reliability of a liquid crystal display element.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A substrate carrier jig which is carried through processes while holding a substrate of a liquid crystal display element, comprising:
    a carrier;
    a sticky layer, provided on said carrier, for adhering the substrate to a surface thereof,
    wherein the adhesion of said sticky layer is maintained substantially constant for repeated use,
    an intermediate layer provided between said carrier and said sticky layer,
    a first adhesive layer for adhering said intermediate layer to a surface of said carrier; and
    a second adhesive layer for sticking said intermediate layer to the surface of said sticky layer,
    said intermediate layer is composed of a PET film,
    said first adhesive layer is composed of epoxy-type resin, and
    said second adhesive layer is composed of silicone-type resin.

2. A substrate carrier jig which is carried through processes while holding a substrate of a liquid crystal display element, comprising:
    a carrier;
    a sticky layer, provided on said carrier, for adhering the substrate to a surface thereof,
    wherein the adhesion of said sticky layer is maintained substantially constant for repeated use,
    an intermediate layer provided between said carrier and said sticky layer,
    a first adhesive layer for adhering said intermediate layer to a surface of said carrier; and
    a second adhesive layer for sticking said intermediate layer to the surface of said sticky layer,
    said intermediate film is composed of a PET film,
    said first adhesive layer is composed of epoxy-type resin,
    said second adhesive layer is composed of epoxy-type resin, and
    said sticky layer is obtained by polymerizing a silicone monomer.

3. A substrate carrier jig which is carried through processes while holding a substrate of a liquid crystal display element, comprising:
    a carrier;
    a sticky layer, provided on said carrier, for adhering the substrate to a surface thereof,
    wherein the adhesion of said sticky layer is maintained substantially constant for repeated use, and
    a light transmitting section for improving transmittance of a visible light, said light transmitting section being provided in a place corresponding to an alignment mark of an electrode pattern formed on the substrate.

4. A substrate carrier jig which is carried through processes while holding a substrate of a liquid crystal display element, comprising:
    a carrier;
    a sticky layer, provided on said carrier, for adhering the substrate to a surface thereof,
    wherein the adhesion of said sticky layer is maintained substantially constant for repeated use,
    an intermediate layer provided between said carrier and said sticky layer, and
    a light transmitting section for improving transmittance of a visible light, said light transmitting section being provided in a place corresponding to an alignment mark of an electrode pattern formed on the substrate.

5. A method of producing a substrate carrier jig which is carried through processes while holding a substrate of a liquid crystal display element, comprising the steps of:
    preparing a carrier;
    forming an adhesive layer by applying epoxy-type resin to said carrier;
    applying a silicone rubber monomer to said adhesive layer; and polymerizing a sticky layer composed of silicone rubber and curing said adhesive layer by carrying out gradually heating up to 100° C. for four hours so as to slowly deaerate the silicone monomer.

6. A method of producing a substrate carrier jig which is carried through processes while holding a substrate of a liquid crystal display element, comprising the steps of:

preparing a carrier;

forming an adhesive layer by applying epoxy-type resin to said carrier;

applying a silicone rubber monomer to said adhesive layer; and polymerizing a sticky layer composed of silicone rubber and curing said adhesive layer by carrying out gradually heating up to 170° C. for two hours so as to slowly deaerate the silicone monomer.

7. A method of producing a substrate carrier jig which is carried through processes while holding a substrate of a liquid crystal display element, comprising the steps of:

(a) preparing a carrier;

(b) preparing an intermediate layer;

(c) applying a second adhesive material to the intermediate layer for sticking said intermediate layer to a surface of a sticky layer;

(d) forming the sticky layer on a coated surface of the second adhesive material for adhering the substrate to be stuck to the surface, the adhesion of said sticky layer being maintained substantially constant for repeated use;

(e) slowly deaerating said sticky layer by heating so that polymerization of said sticky layer and curing of said second adhesive layer are carried out;

(f) applying a first adhesive material to said carrier for sticking said intermediate layer to the surface of said carrier; and (g) adhering the polymerized sticky layer to the coated surface of said first adhesive material.

8. The method of producing a substrate carrier jig as defined in claim 7, wherein:

said intermediate layer of the step (b) is a PET film, said second adhesive material of the step (c) is composed of epoxy-type resin, said sticky layer of the step (d) is composed of a silicone rubber monomer, in the step (e), the heating is gradually carried out up to 100° C. so that the polymerization and the curing are carried out for 4 hours, and said first adhesive material of the step (f) is composed of epoxy-type resin.

9. A method of producing a liquid crystal display element, comprising the steps of:

sticking a substrate to a substrate carrier jig, said substrate carrier jig including:

a carrier, and a sticky layer, provided on said carrier, for adhering the substrate to be stuck to the surface of the carrier, the adhesion of said sticky layer being maintained substantially constant for repeated use;

successively carrying out treatments for forming a liquid crystal display element with respect to the substrate stuck to the substrate carrier jig by carrying the substrate carrier jig through the process for producing the liquid crystal display element; and peeling the substrate from the substrate carrier jig after the prescribed processes so as to stick a new substrate, wherein said substrate carrier jig is reused for producing another liquid crystal display element.

10. The method of producing a liquid crystal display element as defined in claim 9, further comprising the step of printing an insulating film and an alignment film, said step being carried out with the substrate stuck to said substrate carrier jig.

11. The method of producing a liquid crystal display element as defined in claim 10, further comprising the step of carrying out calcination at the time of forming the insulating film and the alignment film, said step being carried out with the substrate stuck to said substrate carrier jig.

12. The method of producing a liquid crystal display element as defined in claim 9, further comprising the step of giving heat treatment to the substrate stuck to the substrate carrier jig while being pressurized during the step of producing the liquid crystal display element.

13. The method of producing a liquid crystal display element as defined in claim 12, wherein the pressurizing is made by using air at 140° C., $2.0 \times 10^5$ Pa for 1.5 hours.

14. The method of producing a liquid crystal display element as defined in claim 12, wherein the pressurizing is made by using air at 150° C., $5.0 \times 10^5$ Pa for 1.5 hours.

15. A method of producing a liquid crystal display element, comprising the steps of:

sticking a substrate to a substrate carrier jig; said substrate carrier jig including:

a carrier, a sticky layer, provided on said carrier, adhesion of said sticky layer for holding the substrate to be stuck to the surface of the carrier being maintained substantially constant even after repeated use, and an intermediate layer provided between said carrier and said sticky layer;

successively carrying out treatments for producing a liquid crystal display element with respect to the substrate stuck to the substrate carrier jig by carrying the substrate carrier jig through the process for producing the liquid crystal display element; and peeling the substrate from the substrate carrier jig after the prescribed processes so as to stick a new substrate, wherein said substrate carrier jig is reused for producing another liquid crystal display element.

16. The method of producing a liquid crystal display element as defined in claim 15, further comprising the step of printing an insulating film, an alignment film, etc., said step being carried out with the substrate stuck to said substrate carrier jig.

17. The method of producing a liquid crystal display element as defined in claim 16, further comprising the step of carrying out calcination at the time of forming the insulating film and the alignment film, said step being carried out with the substrate stuck to said substrate carrier jig.

18. The method of producing a liquid crystal display element as defined in claim 15, further comprising the step of giving heat treatment to the substrate stuck to the substrate carrier jig while being pressurized during the step of producing the liquid crystal display element.

19. The method of producing a liquid crystal display element as defined in claim 18, wherein the pressurizing is made by using air at 140° C., $2.0 \times 10^5$ Pa for 1.5 hours.

20. The method of producing a liquid crystal display element as defined in claim 18, wherein the pressurizing is made by using air at 150° C., $5.0 \times 10^5$ Pa for 1.5 hours.

21. A method of producing a liquid crystal display element, comprising the steps of:

sticking a substrate to a substrate carrier jig; said substrate carrier jig including:

a carrier, a sticky layer provided on said carrier, adhesion of said sticky layer for holding the substrate on the carrier to be stuck to the surface of the carrier being maintained substantially constant even after repeated use, and a light transmitting section for improving transmittance of a visible light, provided in a place corresponding to an alignment mark of an electrode pattern formed on the substrate;

successively carrying out treatments for producing a liquid crystal display element with respect to the substrate stuck to the substrate carrier jig by carrying the substrate carrier jig through the process for producing the liquid crystal display element; and peeling the substrate from the substrate carrier jig after the prescribed processes so as to stick a new substrate, wherein said substrate carrier jig is reused for producing another liquid crystal display element.

22. The method of producing a liquid crystal display element as defined in claim 21 further comprising the step of printing an insulating film and an alignment film, said step being carried out with the substrate stuck to said substrate carrier jig.

23. The method of producing a liquid crystal display element as defined in claim 22, further comprising the step of carrying out calcination at the time of forming the insulating film and the alignment film, said step being carried out with the substrate stuck to said substrate carrier jig.

24. The method of producing a liquid crystal display element as defined in claim 21, further comprising the step of giving heat treatment to the substrate stuck to the substrate carrier jig while being pressurized during the step of producing the liquid crystal display element.

25. The method of producing a liquid crystal display element as defined in claim 24, wherein the pressurizing is made by using air at 140° C., $2.0 \times 10^5$ Pa for 1.5 hours.

26. The method of producing a liquid crystal display element as defined in claim 24, wherein the pressurizing is made by using air at 150° C., $5.0 \times 10^5$ Pa for 1.5 hours.

27. A method of producing a substrate carrier jig which is carried through processes while holding a substrate of a liquid crystal display element, comprising the steps of:

preparing a carrier; and forming a sticky layer within a temperature range on said carrier, adhesion of said stick layer for holding the substrate to be stuck to a surface of said carrier being maintained substantially constant even after repeated use, the temperature range being from a normal temperature to a temperature of not more than 100° C.

* * * * *